United States Patent
Conley, Jr. et al.

(10) Patent No.: US 7,160,819 B2
(45) Date of Patent: Jan. 9, 2007

(54) METHOD TO PERFORM SELECTIVE ATOMIC LAYER DEPOSITION OF ZINC OXIDE

(75) Inventors: John F. Conley, Jr., Camas, WA (US); Yoshi Ono, Camas, WA (US); David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 129 days.

(21) Appl. No.: 11/114,862

(22) Filed: Apr. 25, 2005

(65) Prior Publication Data

US 2006/0240662 A1    Oct. 26, 2006

(51) Int. Cl.
*H01L 21/31* (2006.01)

(52) U.S. Cl. .............. 438/778; 438/689; 438/770; 438/785; 438/625; 257/E21.271

(58) Field of Classification Search .............. None
See application file for complete search history.

(56) References Cited

OTHER PUBLICATIONS

Chen et al., *Surface Modification for Area-Selective Atomic Layer Deposition*, ALD 2003 Conference.

*Primary Examiner*—Michael Lebentritt
*Assistant Examiner*—Kyoung Lee
(74) *Attorney, Agent, or Firm*—David C. Ripma

(57) ABSTRACT

A method for selective ALD of ZnO on a wafer preparing a silicon wafer; patterning the silicon wafer with a blocking agent in selected regions where deposition of ZnO is to be inhibited, wherein the blocking agent is taken from a group of blocking agents includes isopropyl alcohol, acetone and deionized water; depositing a layer of ZnO on the wafer by ALD using diethyl zinc and $H_2O$ at a temperature of between about 140° C. to 170° C.; and removing the blocking agent from the wafer.

15 Claims, 2 Drawing Sheets

METHOD TO PERFORM SELECTIVE ATOMIC LAYER DEPOSITION OF ZINC OXIDE

FIELD OF THE INVENTION

This invention relates to atomic layer deposition (ALD), and specifically to selective ALD having particularly significant use in fabrication of solid state optoelectronics.

BACKGROUND OF THE INVENTION

In the prior art, selective ALD is typically achieved by first depositing a film, coating the film with photoresist, patterning the photoresist, etching the film, and removing the photoresist, using an alternate approach, such as oxygen plasma or acetone dip. Chen et al., *Surface Modification for Area-Selective Atomic Layer Deposition*, ALD 2003 Conference, describes the use of octadecyltrichlorosilate to block ALD of $HfO_2$, using $HfCl_4/H_2O$.

SUMMARY OF THE INVENTION

A method for selective ALD of ZnO on a wafer includes preparing a silicon wafer; patterning the silicon wafer with a blocking agent in selected regions where deposition of ZnO is to be inhibited, wherein the blocking agent is taken from a group of blocking agents including isopropyl alcohol, acetone, deionized water, clean room vinyl glove residue, Fluoroware, and clean room soft cloth residue; depositing a layer of ZnO on the wafer by ALD using diethyl zinc and $H_2O$ at a temperature of between about 140° C. to 170° C.; and removing the blocking agent from the wafer, typically by treatment in an oxygen plasma. The silicon substrate may be a silicon wafer prepared by dipping in an HF dip, preparing a silicon substrate having a $SiO_2$ layer thereon; and preparing a silicon substrate having a $Si_3N_4$ layer thereon.

It is an object of the invention to provide selective ALD of a material in a selected area, without depositing the material in an area where the material is not desired.

Another object of the invention is to provide selective ALD of a material without using conventional photoresist-type masking, which requires etching and film removal.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The problem solved by the invention is how to achieve selective atomic layer deposition (ALD), also known as atomic layer epitaxy (ALE), of a material in a desired area without deposition in adjacent areas, without the use of conventional photoresist processes.

Figure 1:
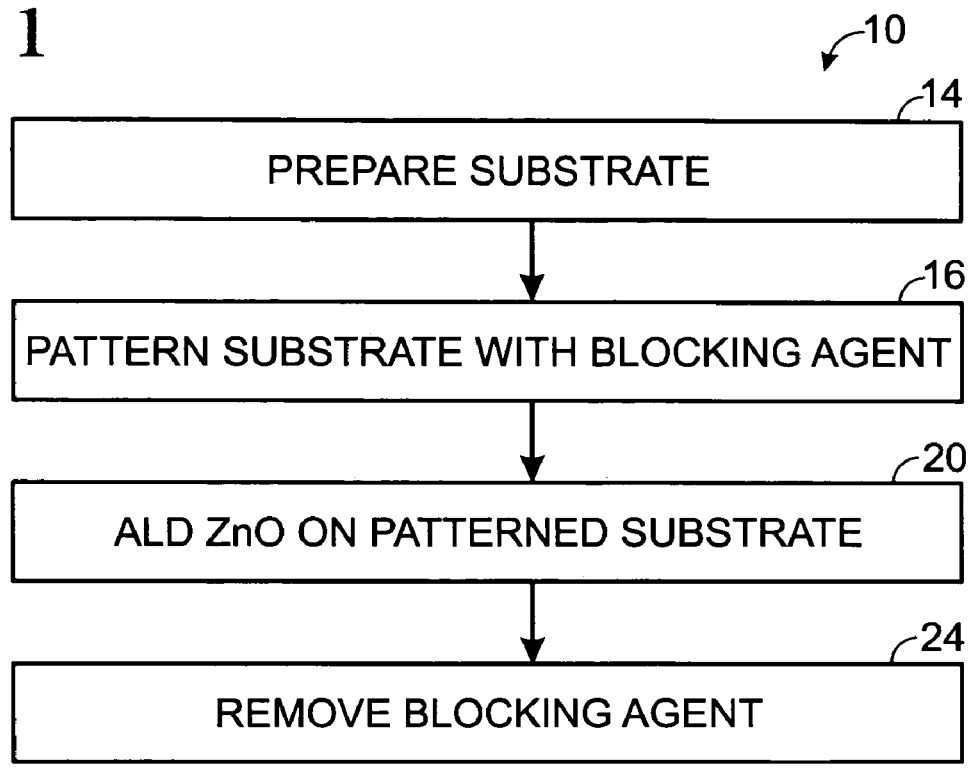
FIG. 1 is a block diagram of the method of the invention.
Figure 2:
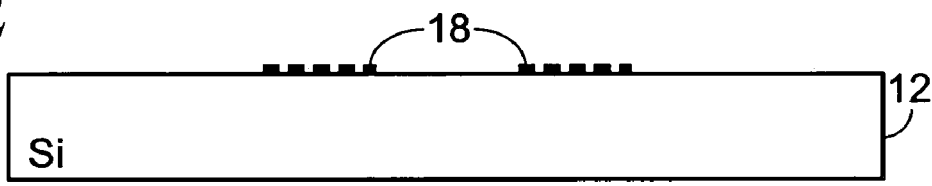
FIGS. 2–4 depicts steps in the method of the invention.

Selective ALD of a film is achieved on a specially modified silicon surface. Referring now to FIGS. 1 and 2, the method of the invention is depicted generally at 10 in FIG. 1, and includes a silicon substrate, or wafer, 12, which is prepared 14 for use in the method of the invention. The substrate may be any of a silicon wafer substrate prepared by performing an HF dip, which may be preceded by a standard RCA cleaning; a silicon substrate having a $SiO_2$ layer thereon; or a silicon substrate having a $Si_3N_4$ layer thereon. The substrate is then patterned 16 with a blocking agent 18, such as isopropyl alcohol (IPA), acetone, deionized water, or clean room vinyl glove residue, Fluoroware, or clean room soft cloth residue, in selected areas. Blocking, or inhibition, of ALD ZnO growth was also observed with appropriate application of the identified blocking agents. The effectiveness of the blocking agent depends on the surface material as well as the method of application. The most complete and uniform blocking is achieved by mechanically "swiping" the surface with either a wetted cotton swab or clean room wipe. In principle, a wiper blade type process might also be used.

Figure 3:
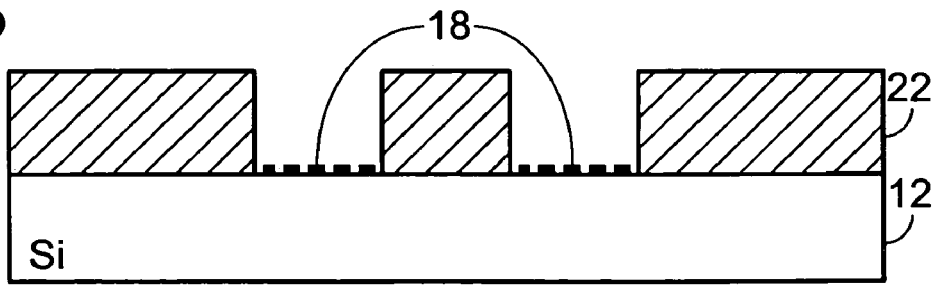

Atomic layer deposition was performed 20, FIG. 3. In the specific embodiment, ALD of ZnO 22 is performed using diethyl zinc (DEZ) and $H_2O$ at between about 140° C. to 170° C. It was observed that, depending on the substrate, growth was inhibited or did not occur in the regions contacted by the inhibiting agent. The blocking agent is removed 24 before further device fabrication by oxygen plasma treatment. Table 1 summarized the effects of various agents applied by either wiping or wetting on various surfaces.

TABLE 1

| INHIBITOR/METHOD | | Silicon | $SiO_2$ | $Si_3N_4$ | Native Oxide |
|---|---|---|---|---|---|
| IPA | Cotton swab | +++ | + | 0 | + |
|  | Cloth Wipe | +++ | + | N/A | N/A |
|  | Wet | + | + | N/A | N/A |
| Acetone | Cotton swab | +++ | +++ | +++ | N/A |
|  | Cloth Wipe | +++ | +++ | N/A | N/A |
|  | Wet | ++ | + | N/A | N/A |
| DI | Cotton swab | +++ | + | N/A | N/A |
|  | Cloth Wipe | +++ | + | + | N/A |
|  | Wet | 0 | 0 | N/A | N/A |
| Glove | Clean Room | +++ | +++ | +++ | +++ |
|  | Chase | 0 | N/A | N/A | N/A |
|  | Nitrile | + | N/A | N/A | N/A |
| Other | Fluoroware | +++ | N/A | N/A | N/A |
|  | Soft Cloth | ++ | + | 0 | N/A |

The silicon surface was observed after a 45 second dip in Hf. The thermally grown $SiO_2$ used had a thickness, on various wafers, of between about 23 nm to 33 nm thick, while the $Si_3N_4$ was about 38 nm thick. In the table, "+++" means a strong inhibition, "++" means weak inhibition, "+" means barely visually detectable with the naked eye, and "0" means no effect. If IPA is only "squirted" on the surface, uniform blocking does not take place, but rather occurs only along an evaporation line that corresponds to the extent of the liquid.

The following conclusions may be drawn from the results depicted in Table 1:
1. IPA, acetone, DI, vinyl clean room glove residue, and Fluoroware, may all be used to achieve ALD selectivity.
2. Acetone and vinyl clean room glove residue were found to work on silicon, $SiO_2$, and $Si_3N_4$.
3. IPA and DI were only strongly effective on silicon.
4. Mechanical swiping, rather than dipping or wetting, seems to be required.

Other results, not depicted in Table 1, were observed:
1. Photoresist slightly inhibits growth of ALD ZnO.
2. ZnO growth on silicon was enhanced by swiping with a dry cotton swab.
3. Polyimid tape strongly inhibits deposition.

Although the mechanism by which inhibition or prevention of ALD occurs is not currently known, preliminary evidence suggests that the active agent is organic. A silicon wafer was dipped in HF for 45 sec and treated with IPA, acetone, IPA, Fluoroware, clean room glove, and DI. The wafer was then exposed to an oxygen plasma resist stripping process. After this process, ALD was performed using DEZ/$H_2O$. Normally, all of these treatments should inhibit subsequent ALD, however, after the oxygen plasma treatment, no inhibition of ALD was observed. This result strongly suggests that some type of organic contamination is involved in the ALD blocking process. This results is supported by Chen et al., supra, wherein use of a large organic molecule, e.g., octadecyltrichlorosilate, was used to block ALD of $HfO_2$, using $HfCl4/H_2O$. Another possibility is that ALD is not completely blocked, but rather, initial nucleation is made more difficult, requiring an increase in the number of incubation cycles.

In other experiment, a series of wafers was treated using various techniques. One wafer was exposed to a 5 min, 400° C., $N_2$ anneal prior to ALD, while another wafer was kept in a box for four days. For the annealed wafer, the effects of the various treatments were still visible but much weaker. This suggest a method wherein a surface may be selectively heated with a laser to achieve patterning. For the box-confined wafer, all of the effects were still observed in roughly the same strength, with the exception of the IPA, which was much reduced.

Figure 4:
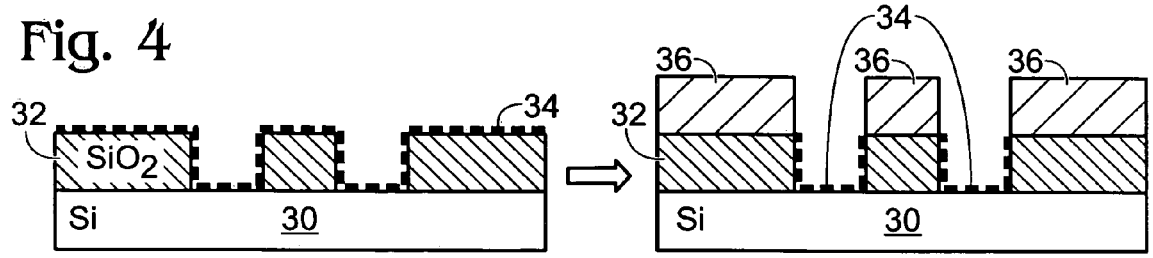

Referring to FIG. 4, Selective ALD may be applied to microelectronic processing to achieve direct patterning of ZnO films for UV optoelectronic devices. One technique, described above, is to directly pattern the IPA, or other agent, only where ALD is to be blocked. Because of the different behavior of IPA on silicon, $SiO_2$ and $Si_3N_4$ surfaces, it may be possible to achieve selective growth on only a particular material. In the wafer depicted in FIG. 4, a wafer 30 with patterned growth of either $SiO_2$ or $Si_3N_4$, 32, on silicon is treated with an IPA blocking agent 34 and then exposed to ALD. As IPA only inhibits growth on the silicon surface, ZnO 36 growth only occurs on the $SiO_2$ or $Si_3N_4$. The fact that mechanical swiping seems to be required renders implementation of these patterning techniques more difficult, although one may envision use of a mechanical wiper blade.

Figure 5:
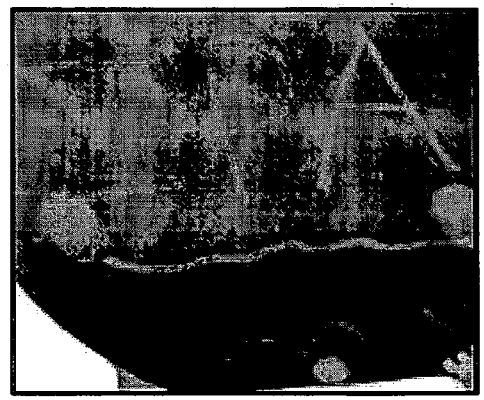
FIGS. 5 and 6 depict wafers used to confirm the utility of the method of the invention.
Figure 6:
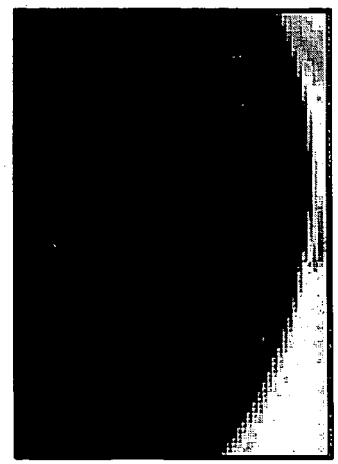

Referring to FIG. 5, a wafer patterned with the letters "IPA" by swiping with a cotton swab dipped in IPA, and subsequently exposed to 100 cycles of ALD using DEZ/$H_2O$ at 140° C. The thickness of the ZnO in the field region is about 47 nm. The region labeled IPA is too narrow to measure via SE, but ALD growth is clearly inhibited. FIG. 6 shows a wafer that was swiped with IPA on a clean room wipe and then subsequently exposed to 100 cycles of ALD using DEZ/$H_2O$ at 140° C. Two regions are apparent. The dark (no IPA wipe) region has about 48 nm of ZnO while in the bright (IPA wipe) region, only about 4.5 nm of ZnO was detected. As the SE probe laser spot is a finite size, the small amount of ZnO detected may actually be due to over lapping regions of growth in the streaks, where IPA perhaps did not contact the wafer as well. The method of the invention has potential in the fabrication of microelectronic processing to achieve direct patterning of ZnO films for UV optoelectronic devices.

Thus, a method to perform selective atomic layer deposition of zinc oxide has been disclosed. It will be appreciated that further variations and modifications thereof may be made within the scope of the invention as defined in the appended claims.

We claim:
1. A method for selective ALD of ZnO on a wafer, comprising:
  preparing a silicon wafer;
  patterning the silicon wafer with a blocking agent in selected regions where deposition of ZnO is to be inhibited;
  depositing a layer of ZnO on the wafer by ALD; and
  removing the blocking agent from the wafer.

2. The method of claim 1 wherein said preparing a silicon wafer includes preparing a silicon wafer by dipping in an HF dip, preparing a silicon substrate having a $SiO_2$ layer thereon; and preparing a silicon substrate having a $Si_3N_4$ layer thereon.

3. The method of claim 1 wherein the blocking agent is taken from a group of blocking agents consisting of isopropyl alcohol, acetone and deionized water.

4. The method of claim 3 wherein the blocking agent is applied by mechanical swiping of the blocking agent on the selected regions of the silicon wafer.

5. The method of claim 1 wherein said depositing a layer of ZnO on the wafer by ALD includes performing atomic layer deposition using diethyl zinc and $H_2O$ at a temperature of between about 140° C. to 170° C.

6. The method of claim 1 wherein said removing the blocking agent includes removing the blocking agent by oxygen plasma treatment.

7. A method for selective ALD of ZnO on a wafer, comprising:
  preparing a silicon wafer;
  patterning the silicon wafer with a blocking agent in selected regions where deposition of ZnO is to be inhibited, wherein the blocking agent is taken from a group of blocking agents consisting of isopropyl alcohol, acetone and deionized water;
  depositing a layer of ZnO on the wafer by ALD; and
  removing the blocking agent from the wafer.

8. The method of claim 7 wherein said preparing a silicon wafer includes preparing a silicon wafer by dipping in an HF dip, preparing a silicon substrate having a $SiO_2$ layer thereon; and preparing a silicon substrate having a $Si_3N_4$ layer thereon.

9. The method of claim 8 wherein the blocking agent is applied by mechanical swiping of the blocking agent on the selected regions of the silicon wafer.

10. The method of claim 7 wherein said depositing a layer of ZnO on the wafer by ALD includes performing atomic layer deposition using diethyl zinc and $H_2O$ at a temperature of between about 140° C. to 170° C.

11. The method of claim 7 wherein said removing the blocking agent includes removing the blocking agent by oxygen plasma treatment.

12. A method for selective ALD of ZnO on a wafer, comprising:
  preparing a silicon wafer;
  patterning the silicon wafer with a blocking agent in selected regions where deposition of ZnO is to be inhibited;

depositing a layer of ZnO on the wafer by ALD using diethyl zinc and $H_2O$ at a temperature of between about 140° C. to 170° C.; and removing the blocking agent from the wafer by oxygen plasma treatment.

13. The method of claim 12 wherein said preparing a silicon wafer includes preparing a silicon wafer by dipping in an HF dip, preparing a silicon substrate having a $SiO_2$ layer thereon; and preparing a silicon substrate having a $Si_3N_4$ layer thereon.

14. The method of claim 13 wherein the blocking agent is applied by mechanical swiping of the blocking agent on the selected regions of the silicon wafer.

15. The method of claim 12 wherein the blocking agent is taken from a group of blocking agents consisting of isopropyl alcohol, acetone and deionized water.

* * * * *